United States Patent
Osmanow et al.

(10) Patent No.: US 6,735,233 B2
(45) Date of Patent: May 11, 2004

(54) GAS DISCHARGE LASER WITH MEANS FOR REMOVING GAS IMPURITIES

(75) Inventors: Rustem Osmanow, Rosdorf (DE); Ulrich Rebhan, Göttingen (DE)

(73) Assignee: Lambda Physik AG, Goettingen (DE)

(*) Notice: Subject to any disclaimer, the term of this patent is extended or adjusted under 35 U.S.C. 154(b) by 0 days.

(21) Appl. No.: 10/170,972

(22) Filed: Jun. 12, 2002

(65) Prior Publication Data

US 2002/0196831 A1 Dec. 26, 2002

(30) Foreign Application Priority Data

Jun. 18, 2001 (DE) .................... 201 10 048 U

(51) Int. Cl.[7] .................................. H01S 3/22
(52) U.S. Cl. ........................... 372/59; 372/57
(58) Field of Search ....................... 372/55–59

(56) References Cited

U.S. PATENT DOCUMENTS

| | | | | |
|---|---|---|---|---|
| 4,233,568 A | * | 11/1980 | Hamerdinger et al. | 372/107 |
| 4,249,143 A | * | 2/1981 | Eden | 372/57 |
| 4,629,611 A | * | 12/1986 | Fan | 423/240 R |
| 4,670,137 A | * | 6/1987 | Koseki et al. | 210/96.1 |
| 4,689,796 A | | 8/1987 | Wright | 372/33 |
| 4,723,254 A | * | 2/1988 | Turner | 372/59 |
| 4,966,669 A | * | 10/1990 | Sadamori et al. | 204/192.12 |
| 5,073,896 A | * | 12/1991 | Reid et al. | 372/59 |
| 5,111,473 A | | 5/1992 | Rebhan et al. | 372/59 |
| 5,199,994 A | * | 4/1993 | Aoki | 118/724 |
| 5,277,040 A | * | 1/1994 | Mitsui | 62/51.1 |
| 5,363,396 A | * | 11/1994 | Webb et al. | 372/57 |
| 5,377,215 A | | 12/1994 | Das et al. | 372/57 |
| 5,748,656 A | | 5/1998 | Watson et al. | 372/35 |
| 6,034,978 A | | 3/2000 | Ujazdowski et al. | 372/34 |
| 6,111,905 A | * | 8/2000 | Wickstrom | 372/59 |
| 6,215,806 B1 | * | 4/2001 | Ohmi et al. | 372/57 |
| 6,330,014 B1 | * | 12/2001 | Arauchi et al. | 347/208 |
| 6,504,861 B2 | * | 1/2003 | Albrecht et al. | 372/59 |
| 6,536,455 B1 | * | 3/2003 | Ide | 134/166 R |
| 6,562,705 B1 | * | 5/2003 | Obara et al. | 438/535 |

FOREIGN PATENT DOCUMENTS

| | | | |
|---|---|---|---|
| DE | 40 27 353 A1 | 4/1991 | H01S/3/036 |
| DE | 40 02 185 A1 | 8/1991 | H01S/3/036 |
| DE | G 94 01 808.1 | 7/1995 | H01S/3/036 |
| DE | 44 41 199 A1 | 5/1996 | H01S/3/036 |
| DE | 198 26 701 A1 | 12/1999 | H01S/3/036 |
| EP | 0 783 193 B1 | 7/1997 | H01S/3/036 |

OTHER PUBLICATIONS

Internet printout of Abstract of Japanese patent No.: JP3163888, publication date Apr. 25, 1991, printed Jul. 29, 2002.
Patent abstracts of Japan: Publication No.: 01222493, Sep. 5,1998; Application No.: 63048262, Feb. 29, 1988, 1 Sheet.
Patent abstracts of Japan: Publication No.: 06224495, Aug. 12,1994; Application No.: 05011457, Jan. 27, 1993, 1 Sheet.

* cited by examiner

*Primary Examiner*—Paul Ip
*Assistant Examiner*—Phillip Nguyen
(74) *Attorney, Agent, or Firm*—Stallman & Pollock LLP

(57) ABSTRACT

In an excimer laser or a molecular fluorine laser, a heating element is used which is heated to temperatures in excess of 60° C., in order to remove impurities from the laser gas.

6 Claims, 1 Drawing Sheet

GAS DISCHARGE LASER WITH MEANS FOR REMOVING GAS IMPURITIES

BACKGROUND OF THE INVENTION

1. Field of the Invention

The invention relates to gas discharge lasers, in particular excimer lasers or molecular fluorine lasers, which emit laser radiation in the UV range or in the VUV range of the electromagnetic spectrum.

Such lasers contain suitable gas mixtures in the gas discharge space.

2. Description of Related Art

The problem of contamination of the gas mixture has been known for a long time. Impurities in the laser gas have negative effects on the gas lifetime, the laser pulse energy, the stability and other properties of the laser. The impurities can both influence the laser process itself and, in particular, have negative effects owing to build-ups on components of the laser, for example in the form of deposits on optical surfaces or on the windows of the gas discharge chamber.

It is, for example, known in the prior art to remove impurities from the laser gas by using so-called cold traps.

DE 198 26 701 A1 addresses the problem of water ($H_2O$), which is also known as a detrimental impurity, in the laser gas. The gas mixtures in excimer lasers are usually made up from commercially available gases and gas mixtures. In this case, commercially available gases are generally contaminated with $H_2O$ at a level of 1–2 ppm. This means that $H_2O$ is re-introduced into the gas discharge space every time the gas is changed. Even at this concentration, water has a negative effect on the properties of the laser, in particular the working life. Water can also enter the gas discharge space from the outside, or may alternatively become desorbed from the surfaces of the walls of the chamber or of optical components. The remarks above concerning $H_2O$ likewise apply to other substances as well, for example $N_2$ and $O_2$, which are also considered as detrimental impurities.

DE 198 26 701 proposes the use of a hygroscopically active medium in order to remove $H_2O$ from the laser gas.

BRIEF SUMMARY OF THE INVENTION

It is an object of the invention to provide another effective means for the removal of impurities from laser gas, which removes not only $H_2O$ but also other impurities.

DETAILED DESCRIPTION

Figure 1:
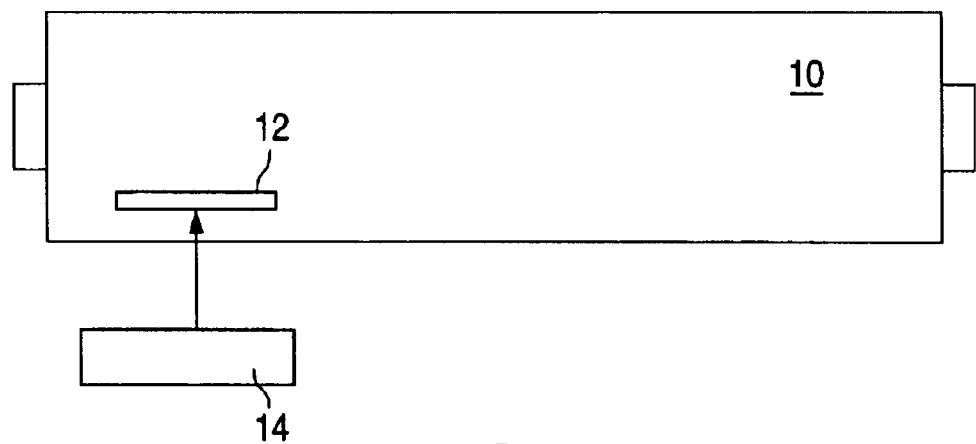
FIG. 1 schematically shows an excimer laser with a heating element in the interior of the gas discharge chamber.

The invention is based on the discovery that, when heated to above 60° C., a heating element has an effect consistent with the object stated above, and removes impurities such as $H_2O$, $N_2$ and $O_2$. In particular, heating elements which consist of a metal or have an at least partially metallic surface, have been found to be effective. Metals such as Zr, Hf, Ti and W, or alloys which contain at least one of these metals, have been found to be particularly suitable.

The theoretical explanation for the effect of such heating elements is as follows: at the said temperatures on the metal surface, reactions are induced with $H_2O$ as well as with $N_2$ and $O_2$, which lead to a reduction of the said impurities from the laser gas. The heating element may be operated both during the laser operation and, especially, when the gas is being changed. It may also be set in operation, i.e. heated to desired setpoint temperatures, at regular intervals (intermittently).

The heating element according to the invention should not be confused with a device for regulating the temperature of laser gas in an excimer laser as known, for example, from the German Utility Model G 94 01 808 and likewise from EP 0 783 193 B1 as well. In the latter prior art, the laser gas is warmed to temperatures in the range of from 35° C. to 40° C., in order to improve and stabilise the laser performance. The present invention does not involve this. Rather, the heating element according to the invention causes only local, i.e. spatially limited heating of the laser gas to temperatures which are sufficient to achieve the effect of purifying the laser gas. The heating-element temperatures used for this are significantly higher than those temperatures to which the laser gas is warmed in the said prior art, in order to achieve the effect of performance improvement and stabilisation. The effect, according to the invention, of removing gas impurities from the laser gas is further enhanced with an increasing temperature of the heating element beyond 60° C. Temperatures above 70° C., particularly preferably above 80° C. and, more preferably, above 100° C. are used. Temperatures of up to 2000° C. or more have shown good results.

It has been possible to demonstrate an extension of the gas lifetime, and also an improvement in the gas quality, the latter in particular being shown by the fact that the high voltage for the gas discharge of the laser could be set to a lower level after using the heating element according to the invention than without heating of the heating element.

It is possible to use a single heating element, or a plurality of heating elements may be used at different positions in the gas discharge chamber of the laser. In this case, the overall dimensions of the heating elements, and of their timing controller, are designed in such a way that, although impurities are removed owing to local heating, heating of the laser gas as a whole to temperatures which are detrimental to the laser performance does not take place. These latter temperatures are encountered in the prior art described above (that is to say, for example, temperatures of around 40° C. in the case of an excimer laser according to DE-GM G 94 01 808).

According to a preferred configuration of the invention, the heating element is (or a plurality of heating elements are) arranged in a separate gas space, which can be connected to the actual gas discharge chamber of the laser via lines. In this variant of the invention, it is possible to provide a separate modular unit, which can be readily connected to the gas discharge chamber via the said lines, in order to remove gas impurities in the described way. In this case, valves may preferably be arranged in the said lines, in order to control the gas exchange between the gas discharge chamber of the laser and the gas space with the heating element. A pump may also be used, optionally with filters in which the impurities or undesired reaction products are removed by the heating element. So that the pump itself does not introduce any undesired impurities into the laser gas, a dry-running pump or a diaphragm pump is preferably used. This prevents, in particular, undesired hydrocarbons from entering the laser gas.

The invention also concerns a method for removing impurities from the laser gas of a gas discharge laser, in particular an excimer laser or a molecular fluorine laser, in which a part of the laser gas is heated to temperatures in excess of 60° C.

In this method, it is preferable for the part of the laser gas to be heated to temperatures in excess of 100° C.

It is furthermore preferable in the method for laser gas flowing past a heating element (12) to be locally heated.

Figure 2:
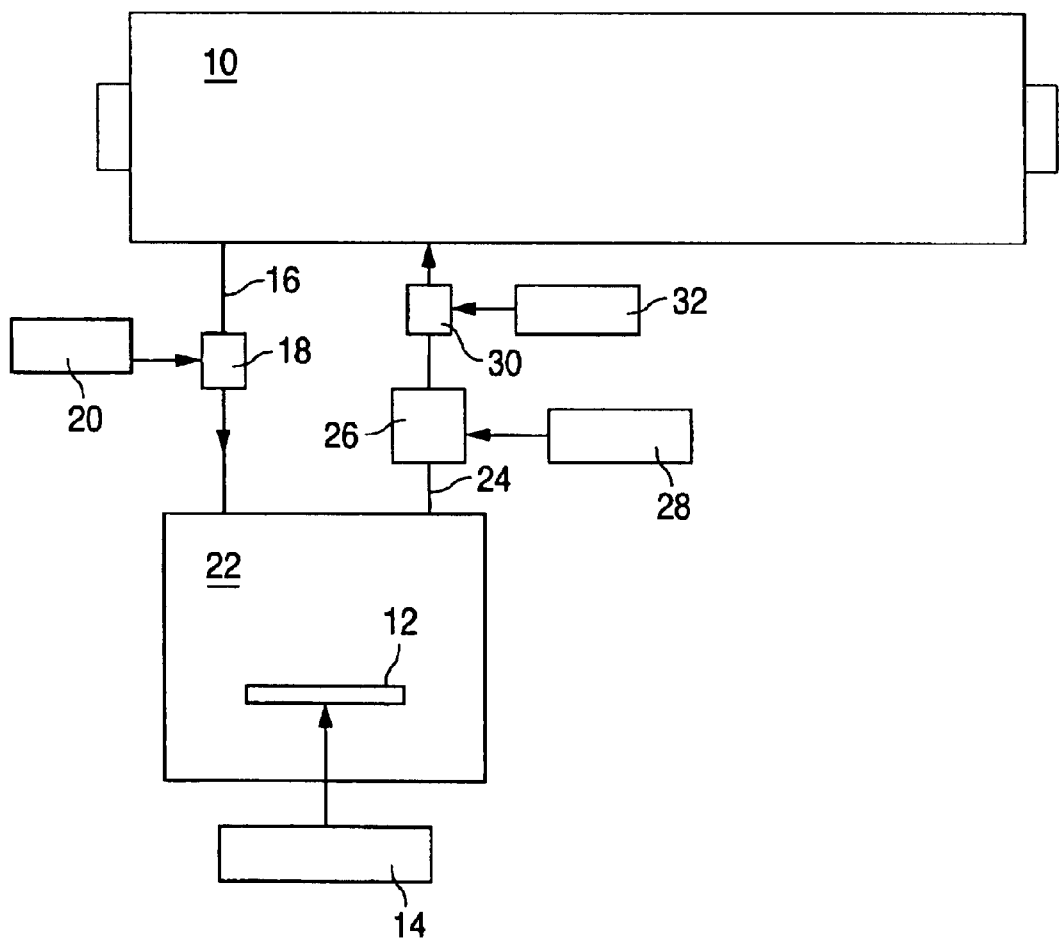
FIG. 2 shows an excimer laser with a separate unit which contains a heating element.

Exemplary embodiments of the invention will be described in more detail below with reference to the drawing, in which:

FIG. 1 schematically shows an excimer laser with a heating element in the interior of the gas discharge chamber; and FIG. 2 shows an excimer laser with a separate unit which contains a heating element.

FIG. 1 schematically shows a gas discharge chamber 10 ("laser tube") of an excimer laser. Details are known to the person skilled in the art. A heating element 12 made of one of the aforementioned metals (Zr, Hf, Ti, W, or an alloy which contains at least one such metal) is arranged in the interior of the gas discharge chamber 10 of the laser. It is also possible for a plurality of heating elements to be arranged at suitable positions in the laser, that is to say at positions where they do not interfere with the actual laser operation, such as the gas discharge, or possible optical components and functions. Otherwise, there are no restrictions on the arrangement of the heating element, or the plurality of heating elements. The heating element may, for example, be configured in the form of a coil, such as an incandescent filament. In proportion to its mass, it should have a surface area which is as large as possible, in order to achieve a large effect with a low heating power. According to one exemplary embodiment, an incandescent filament as the heating element, in the form of a coil made of one of the aforementioned metals and with a diameter of approximately 2 to 3 mm, was warmed to temperatures of from 60° C. to 2000° C., and the advantageous effects described above were achieved. The heating of the heating element 12 is carried out using a controller 14, which supplies the heating element with electricity and regulates the current. For example, the controller 14 may be used to detect the instantaneous temperature of the heating element 12 (for example by measuring the instantaneous resistance) and the current is regulated accordingly in order to adjust a predetermined setpoint temperature of the heating element 12. It is clear that appropriate electrical feeds through the wall of the gas discharge chamber 10, from the controller 14 to the heating element 12, are necessary for this.

FIG. 2 shows a further embodiment, in which the heating element 12 is arranged not directly in the gas discharge chamber 10 of the laser, but rather in a separate gas space 22, which can be selectively connected to the gas discharge chamber via lines 16, 24. Valves 18, 30 in the lines 16 and 24, respectively, are used for this. The gas flow in the lines is marked by arrows. The valve 18 is activated by means of a controller 20 which, for example, may be controlled by means of the control computer of the laser. A pump 26 in the return line 24 is actuated by a controller 28, and the valve 30 is actuated accordingly by a controller 32.

The heating element 12 in the gas space 22 is heated by means of the controller 14 in a corresponding way to the heating element 12 according to FIG. 1. The heating may be carried out, for example, when the gas is being changed and/or permanently, or alternatively intermittently at predetermined time intervals during the laser operation, in each case with appropriate valve and pump control. To that end, the valve 18 is opened by means of the controller 20, as is the valve 30 in the return line 24. The pump 26 is set in operation, so that gas from the gas discharge chamber 10 enters the gas space 22 via the line 16, and in doing so comes into contact with the surface of the heating element 12. The heating element 12 (represented only schematically in FIG. 2) is in this case positioned in the gas space 22 in such a way that impurities come into contact with the surface of the heating element with the greatest possible efficiency.

What is claimed is:

1. An excimer or molecular fluorine laser system including:
    a gas discharge chamber for discharging a laser gas, the laser gas having one or more impurities;
    a metal heating element disposed in the gas discharge chamber, said heating element having an exposed metal surface area in contact with the laser gas in the gas discharge chamber, and said heating element generating heat in response to conducting an electrical current; and
    a controller coupled to the heating element, wherein the controller controls the amount of electrical current conducted through the heating element, and as a result of electricity being conducted through the heating element, the heating element generates heat excess of 60° C., wherein when the heating element is heated, an impurity of the laser gas reacts with the exposed metal surface and is removed from the laser gas.

2. The excimer or molecular fluorine laser system of claim 1, wherein the controller operates to control the temperature of the heating element by controlling the amount of electricity conducted through the heating element.

3. The excimer or molecular fluorine laser system of claim 1, wherein the metal heating element is an incandescent filament formed into a coil.

4. An excimer or molecular fluorine laser system including:
    a gas discharge chamber for discharging a laser gas, the laser gas having one or more impurities;
    a gas space separate from the gas discharge chamber, wherein a first gas transport line couples the separate gas space to the gas discharge chamber, and the first gas transport line operates to transport laser gas from the gas discharge chamber to the separate gas space, and wherein a second gas transport line is coupled to the separate gas space and the gas discharge chamber, and the second gas transport line operates to transport laser gas from the separate gas space to the discharge chamber;
    a metal heating element which is disposed in the separate gas space, and wherein the metal heating element has an exposed metal surface area in contact with the laser gas in the separate gas space, and said heating element generating heat in response to conducting an electrical current; and
    a controller coupled to the heating element, wherein the controller controls an amount of electricity conducted through the heating element, and as a result of electricity being conducted through the heating element, the heating element generates heat in excess of 60° C., wherein, when the heating element is heated, an impurity of the laser gas reacts with the exposed metal surface are and is removed from the laser gas.

5. The excimer or molecular fluorine laser system of claim 4, wherein the controller operates to control the temperature of the heating element by controlling the amount of electricity conducted through the heating element.

6. The excimer or molecular fluorine laser system of claim 4, wherein the metal heating element is an incandescent filament formed into a coil.

* * * * *